(12) United States Patent
Venugopal et al.

(10) Patent No.: US 7,676,012 B1
(45) Date of Patent: Mar. 9, 2010

(54) SPREAD SPECTRUM CONTROLLABLE DELAY CLOCK BUFFER WITH ZERO CYCLE SLIP

(75) Inventors: Narendar Venugopal, Santa Clara, CA (US); Dan I. Hariton, Santa Clara, CA (US); Dipankar Mandal, Bangalore (IN); Sushil Kumar, Bangalore (IN); Werner Hoeft, Santa Clara, CA (US)

(73) Assignee: Pulsecore Semiconductor Corp., Santa Clara, CA (US)

( * ) Notice: Subject to any disclaimer, the term of this patent is extended or adjusted under 35 U.S.C. 154(b) by 1484 days.

(21) Appl. No.: 10/831,017

(22) Filed: Apr. 22, 2004

(51) Int. Cl.
*H03D 3/24* (2006.01)
(52) U.S. Cl. .................. 375/376; 375/130
(58) Field of Classification Search .......... 375/376, 375/375, 374, 373, 371, 130; 331/23, 17, 331/10
See application file for complete search history.

(56) References Cited

U.S. PATENT DOCUMENTS

| | | | | |
|---|---|---|---|---|
| 5,872,807 A * | 2/1999 | Booth et al. | .............. | 375/130 |
| 6,046,646 A * | 4/2000 | Lo et al. | .............. | 331/10 |
| 6,240,123 B1 * | 5/2001 | Zhang et al. | .............. | 375/130 |
| 6,294,936 B1 * | 9/2001 | Clementi | .............. | 327/156 |
| 6,351,485 B1 * | 2/2002 | Soe et al. | .............. | 375/130 |
| 6,606,005 B2 * | 8/2003 | Chang | .............. | 331/78 |
| 6,697,416 B1 * | 2/2004 | Jennings | .............. | 375/130 |
| 6,703,902 B2 * | 3/2004 | Jeon et al. | .............. | 331/17 |
| 6,850,554 B1 * | 2/2005 | Sha et al. | .............. | 375/140 |
| 6,975,148 B2 * | 12/2005 | Miyata et al. | .............. | 327/156 |
| 6,980,581 B1 * | 12/2005 | Sha et al. | .............. | 375/130 |
| 2002/0171457 A1 * | 11/2002 | Fujiwara | .............. | 327/113 |
| 2004/0213324 A1 * | 10/2004 | Hall et al. | .............. | 375/130 |

OTHER PUBLICATIONS

Keith B.Hardin, John T.Fessler, Donald R.Bush, "Spread Spectrum Clock Generation for the Reduction of Radiated Emissions", Lexmark International Inc, 1994 IEEE.*
Lt Cdr NJ Heredia, "Spread spectrum clock-An EMC solution for new generation portable computers", Naval EMC Centre, Mumbai, Proceedings of INCEMIC 2001-2002.*
Michael T. Zhang, "Notes on SSC and Its Timing Impacts", Intel Corp, Feb. 1998.*
David Rosemarin, Wide Bandwidth Frequency Modulation of Phase Lock Loops, RF Design, Feb. 2000, pp. 24-32.

* cited by examiner

*Primary Examiner*—Chieh M Fan
*Assistant Examiner*—Aristocratis Fotakis
(74) *Attorney, Agent, or Firm*—Harris Zimmerman; Howard Cohen (57) ABSTRACT

A controllable delay clock buffer that provides spread spectrum modulation of the output signals with zero cycle slip includes a PLL having a PLL loop filter that comprises an RC network. A clock signal is input to the PLL, and a SS modulation frequency is injected into the capacitor of the PLL loop filter. The SS signal is provided by a secondary charge pump that produces a programmable waveform such as a square wave or a stair case square wave current signal. The programmable waveform is integrated by the loop filter capacitor to form a corresponding triangular or trigonal waveform which varies the input to the VCO of the PLL to define a frequency modulation profile that has a corresponding triangular or trigonal envelope. The bandpass profile of the SS modulation signal is at a higher frequency range than the lowpass profile of the PLL, so that the SS waveform profile is not distorted or cancelled by the PLL.

1 Claim, 12 Drawing Sheets

SPREAD SPECTRUM CONTROLLABLE DELAY CLOCK BUFFER WITH ZERO CYCLE SLIP

CROSS-REFERENCE TO RELATED APPLICATIONS

Not applicable.

FEDERALLY SPONSORED RESEARCH

Not applicable.

SEQUENCE LISTING, ETC ON CD

Not applicable.

BACKGROUND OF THE INVENTION

1. Field of the Invention

This invention relates to a controllable delay clock buffer and, more particularly, to a controllable delay clock buffer that provides spread spectrum modulation of the clock signal and zero cycle slip.

2. Description of Related Art

A controllable delay buffer is a device that accepts an input signal (typically a periodic clock signal) and provides an output that has its transition edges phase aligned (controlled) with respect to those of the input signal. The definition of a transition edge is a change in voltage or current from one stable state to another. Phase alignment implies that the measured phase (time) difference between the 2 edges of the input and output is less than a certain specified value.

Controllable delay clock buffers are typically connected to synchronize and buffer multiple identical output clock signals to an input reference clock. There is a minimum time delay between the output clock edges and the reference input clock edges, which relates to the phase alignment of the signals.

In the prior art, there are generally two types of controllable delay clock buffers. Conventional controllable delay buffers have both input and output clocks without spread spectrum modulation, but these devices provide no benefit in EMI reduction. On the other hand, spread spectrum-capable controllable delay buffers have an input reference clock that is spread spectrum modulated, passing the SS modulation undistorted to all output parallel clocks. There is a minimum delay between input and outputs, and the SS modulation is always maintained ON at all outputs.

BRIEF SUMMARY OF THE INVENTION

The present invention generally comprises a controllable delay clock buffer that provides spread spectrum modulation of the output signals with zero cycle slip. In one aspect, the invention provides a controllable delay buffer in which a PLL is connected to a PLL loop filter, and the SS modulation frequency is injected into the PLL loop filter. A typical loop filter is an RC series network connected to ground, and the signal may be a controlled current injected into the capacitor of the loop filter. This technique enables the application of spread spectrum modulation to a PWM system with a minimum number of additional components.

The SS signal is provided by a secondary charge pump that produces a current signal (the SS modulation signal) having generally symmetrical excursions about a zero axis and hence a zero average value. The programmable current waveform is integrated by one of the loop filter capacitors to create a waveform that effectively varies the input to the VCO of the PLL to define a frequency modulation profile that defines the modulation envelope of the SS output signal. In one embodiment, the SS modulation signal is a square wave having a constant amplitude and period, which produces a SS modulation envelope that has a generally triangular configuration. In another embodiment, the SS modulation signal is a square wave having varying amplitude and period, which produces a SS modulation envelope that has a modified triangular configuration in which each leg of the triangle is comprised of segments that differ in slope and length. This wave configuration is defined herein as a trigonal waveform.

The bandpass profile of the SS modulation signal is at a higher frequency range than the lowpass profile of the PLL, so that the SS waveform profile is not distorted or cancelled by the PLL closed loop reaction time.

The modulation profile of the integrated SS modulation signal determines the frequency excursions of the output. Varying the frequency and amplitude of the SS modulation signal varies the modulation rate (MR) and determines the frequency deviation of the output signal. Thus it is easy to control the SS modulation rate and the maximum per-cycle offset between the input clock signal and SS output transitions (i.e., the transition edge wandering of the output signal is a controlled fraction of the input clock cycle). Indeed, the SS modulation signal may be controlled to achieve other modulation profiles and frequency characteristics.

In a short-term frame of reference, i.e. in a time interval smaller than the PLL closed loop bandwidth reaction time, the invention provides zero cycle slip. The output cycle is compared to the input cycle for advances or delays. This comparison of the timing waveforms exhibits cyclic advances and delays at the SS modulation rate. Fractional cycle slips or multiple cycle slips may occur once, positive and negative, within one SS modulation cycle, but the net long-term cycle slip is nil, i.e. in a time interval larger than the PLL closed loop bandwidth reaction time. It is the frequency tracking of the locked PLL that governs this process. For long term averages the input clock frequency and the closed PLL assure that the average PLL output frequency equals the PLL input frequency (otherwise, the PLL would lose lock). This factor (long time interval with respect to the PLL response time) guarantees zero cycle slip of the output with respect to the input, whether or not the SS modulation signal is injected into the loop.

The source of the SS modulation signal may be located within the same IC chip in which the PLL is disposed. Alternatively, the SS modulation signal may be supplied by an external source. In one embodiment two charge pumps are provided. One charge pump can source or sink (I1-I2) amount of current and another one can source or sink I2 amount of current. Each charge pump contains two current sources and they are selectively controlled by a switch to generate any desired SS modulation signal and corresponding modulation envelopes.

In some applications the external SS modulation signal may not exhibit a 50% duty cycle, which would create an integration product that is an asymmetrical envelope and result in a frequency modulation offset that is unacceptable. For example, in some video applications the HSYNC signal has a 10% duty cycle. To overcome this potential difficulty, the invention alters the current amplitude of each half cycle of the SS modulation signal so that the current during the ON excursion is 10 times greater than the opposite current during the OFF excursion, whereby equal and opposite currents are supplied during each cycle and a symmetrical frequency variation is achieved. This technique may be applied to any SS modulation signal that does not have a duty cycle suitable for use in the spread spectrum modulation scheme of the invention.

BRIEF DESCRIPTION OF THE DRAWING

FIGS. 6A and 6B are graphic comparisons of the input and output signals of the invention, showing a condition in which the spread spectrum modulation is ON.

DETAILED DESCRIPTION OF THE INVENTION

The present invention generally comprises a method and apparatus for a controllable delay clock buffer that provides spread spectrum modulation of the output signal. The invention involves the use of a PLL, which typically includes a loop filter comprised of a RC network. With regard to FIG. 1, at a broad level a PLL loop filter 21 includes a series combination of resistor 23 and capacitor 22 connected between ground and the input of a frequency divider 24. Another typically smaller value capacitor 26 optionally may be connected in parallel to the series RC circuit. As is well known in the art, the RC time constant of components 22, 23, and 26 set the passband of the PLL in conjunction with the primary charge pump current {amperes} and with the VCO constant [hertz/volt]. The input of VCO #24 may be connected at terminal 1 to a phase detector charge pump output.

Figure 1:
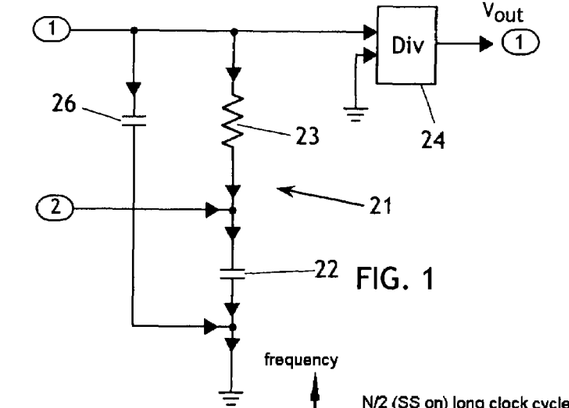
FIG. 1 is a functional block diagram showing the fundamental concept of the method and apparatus of the present invention.
Figure 2:
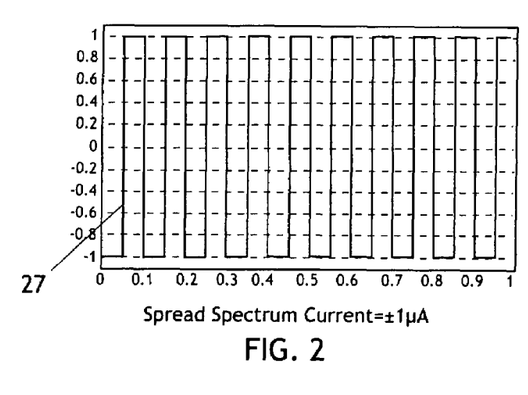
FIG. 2 is a graphic representation of a spread spectrum modulation signal of the present invention.
Figure 3:
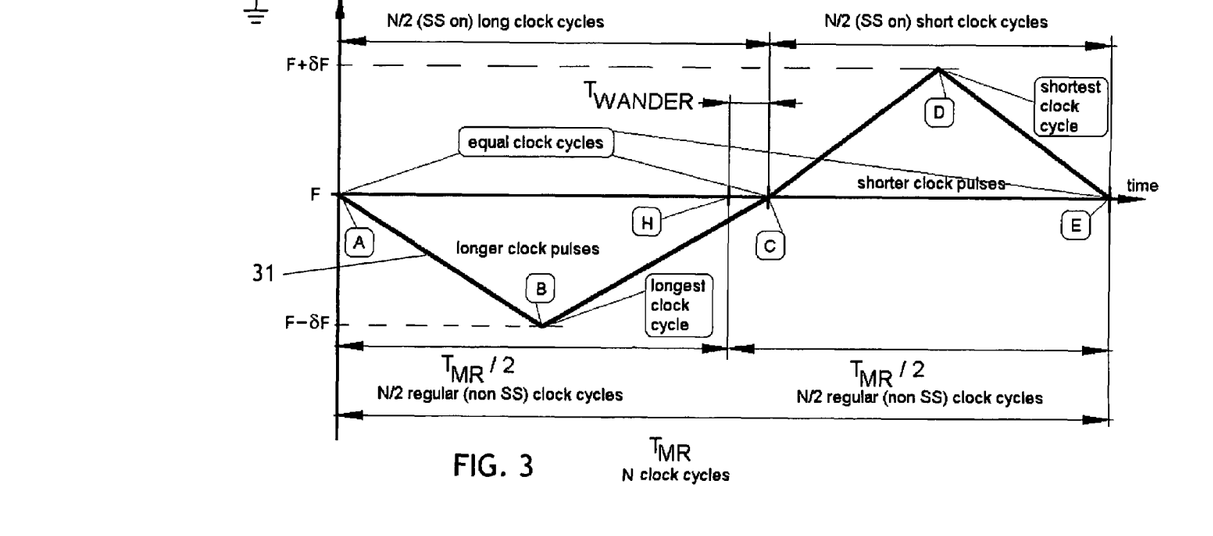
FIG. 3 is a graphic representation of frequency versus time showing the frequency modulation envelope generated by the spread spectrum modulation signal of FIG. 2.

A fundamental innovation of the invention is the injection of the spread spectrum modulating signal into the loop filter 21 at capacitor 22 to produce a spread spectrum output of the PLL. At terminal 2 a current signal from a second charge pump is connected to the junction of components 22 and 23. As shown in FIG. 2, the current signal comprises in this example a programmable waveform such as the square wave signal 27 having generally a 50% duty cycle and equal excursions about the zero current axis. The programmable waveform 27 is integrated by the loop filter capacitor 22 to form a triangular voltage waveform 31, an example of which is shown in FIG. 3. The triangular waveform effectively varies the voltage level of the input to the VCO of the PLL to cause the VCO to vary its output within a frequency modulation profile that in this example has a corresponding triangular envelope.

At the beginning of a SS modulation cycle, the clock cycle at A has the frequency F. With SS modulation ON the clock period increases linearly until it reaches it maximum length (minimum frequency) at B. From B to C the clock period decreases linearly. Again, passing through C the clock cycle has the frequency F. From C to D the clock period continues to decrease at the same linear rate until it reaches its shortest length (maximum frequency) at D. From D to E the clock period increases such that at E the clock cycle frequency is again F. Then the SS modulation cycle repeats, with the end-point E becoming the start-point A of the next MR cycle. For symmetry reasons each of the AB, BC, CD, DE segments contains and equal number of clock pulses, i.e. each has N/4 clock pulses (the clock pulses have unequal length).

Thus, merely by injecting a modulating signal into the loop filter 21, and without requiring any further additional components, coupling components, or modifications to a PLL configuration, SS modulation may be added to the PLL output.

Figure 4:
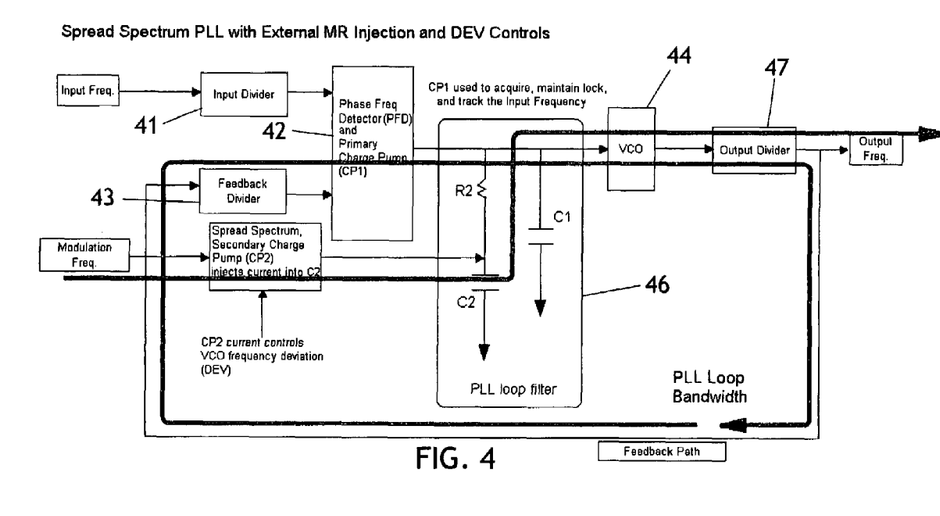
FIG. 4 is a function block diagram of an embodiment of the apparatus of the invention, a phase lock loop having spread spectrum frequency modulation injected into the loop filter of the PLL.

With regard to FIG. 4, there is depicted one embodiment of a PLL with Spread Spectrum output in accordance with the present invention. An input frequency, for example a master clock signal is fed through an input divider 41 to a phase frequency detector 42, which includes a primary charge pump CP1. The detector 42 also receives an input from a feedback divider 43, and the phase product output is fed to a VCO 44. Note that the PLL loop filter 46, comprised of C2 and R2 in series with C1 in parallel, is connected between the input of the VCO and ground, as described previously. An output divider 47 divides the VCO output to produce an output frequency, which is fed back to the feedback divider 43. The components 41-47 form a PLL arrangement that exemplifies the prior art. Typically, the PLL will lock onto an input frequency so that the output signal is phase locked to the input signal.

The invention introduces a SS modulation frequency that is created by a secondary charge pump CP2. This may comprise a DAC that receives a digital control signal and produces the desired current signal, or any equivalent arrangement. The SS modulation signal has a waveform substantially similar to the signal shown in FIG. 2, and the capacitor C2 integrates the signal to form a triangular waveform as shown in FIG. 3. The triangular waveform affects the voltage level at the VCO input and causes a SS frequency modulation effect.

Figure 5A:
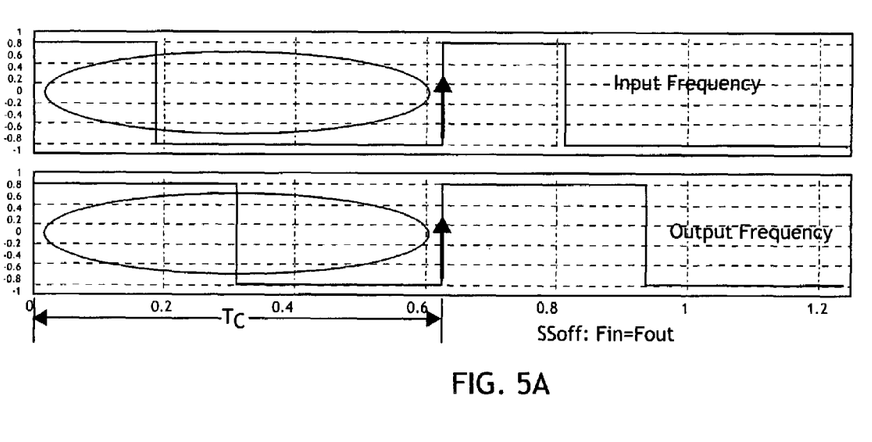
FIGS. 5A and 5B are graphic comparisons of the input and output signals of the invention, showing a condition in which the spread spectrum modulation is off.
Figure 5B:
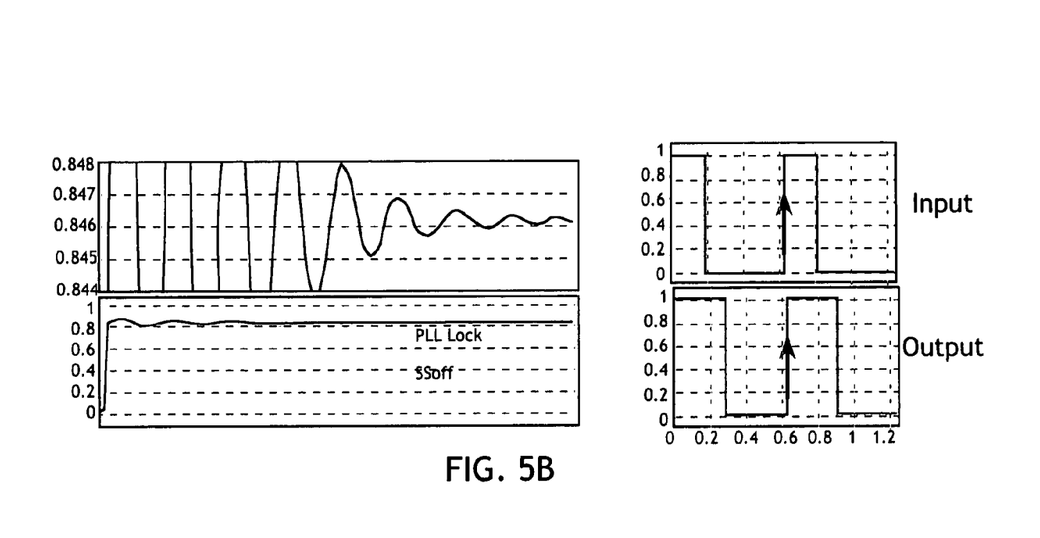

To describe the operation of the circuit of FIG. 4, consider first the situation in which no SS modulation signal is applied by CP2. As shown in FIG. 5A, the input frequency equals the output frequency, and, in this example, the leading edge of each programmable waveform exemplified but not limited to the square wave shown upward transition of the input signal is phase aligned with the output frequency. The output pulses may have differing duty factors with respect to the input pulses, but the frequency and phase alignment are assured by the locking condition of the phase lock loop. In FIG. 5A, the ellipsoids represent the rising edge, synchronized, equal periods (Tc=1/Fc) of the input frequency Fin and the output frequency Fout. In FIG. 5B, the upper graph is the magnified VCO input voltage, while the lower graph charts the full scale input to the VCO: this signal settles quickly as the loop locks onto the input signal. This is typical PLL operation (acquisition). The input and output frequency waveforms are shown as two right hand plots of FIG. 5B.

Figure 6A:
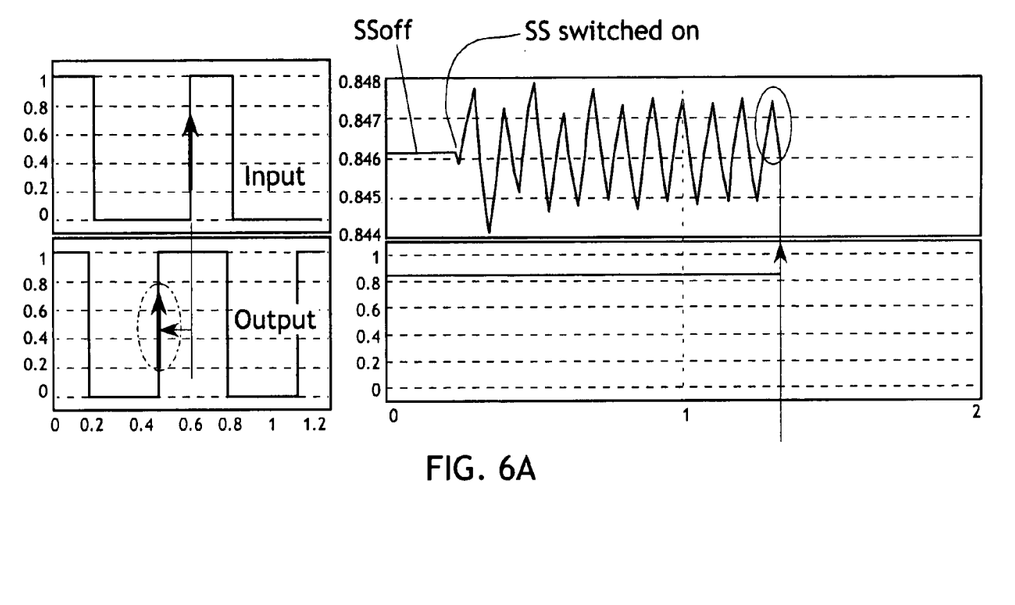

With regard to FIG. 6A, when the SS modulation signal is switched on the fairly constant VCO input is modulated in a somewhat sawtooth alternating pattern. The programmable waveform transitions of the output signal are shifted leftward with respect to the input signal as Fout is driven by a positive excursion of the SS signal to go higher than Fin. At the point in time highlighted in the ellipse of FIG. 6A, Fout has been higher than Fin for the maximum amount of time. As a result the Fout rising edge has traveled to the left and reached its maximum "lead" displacement, and begins to move retrograde to the right as the next several pulses are processed. This point in time corresponds to point A or E of graph 31 of FIG. 3, where the triangular frequency modulation envelope crosses the zero axis and Fin=Fout.

Figure 6B:
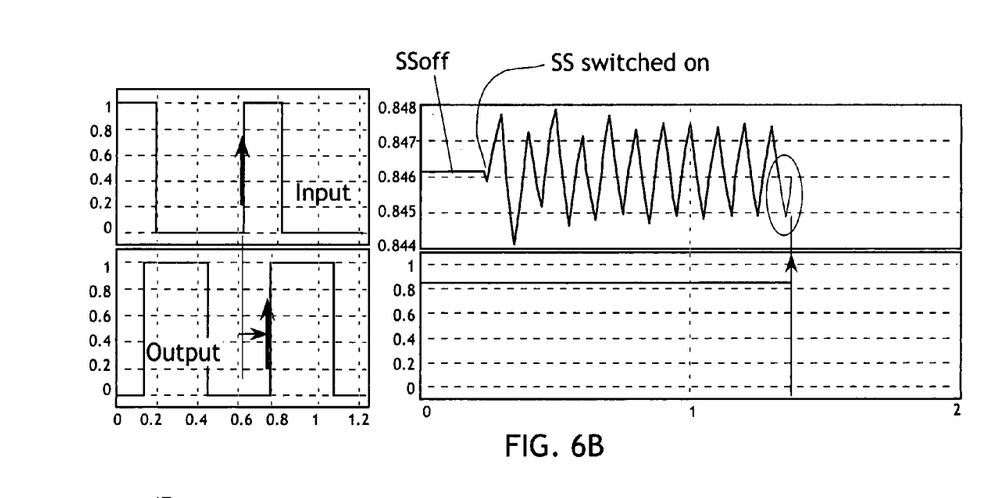

Thereafter, as shown in FIG. 6B, the transition edges of the output pulses drift successively to the right with respect to the input clock signal as the output frequency diminishes below the input frequency. This part of the cycle corresponds to the system moving from point A to point B and beyond. At the point of time noted in the ellipse of FIG. 6B, the F out has been lower than Fin for the maximum amount of time, and the Fout rising edge has traveled to the right and reached its maximum "lag" rightward displacement. This is point C in graph 31 of FIG. 3. Thereafter the process reiterates, the SS frequency modulating smoothly and continuously about the input frequency.

Figure 7A:
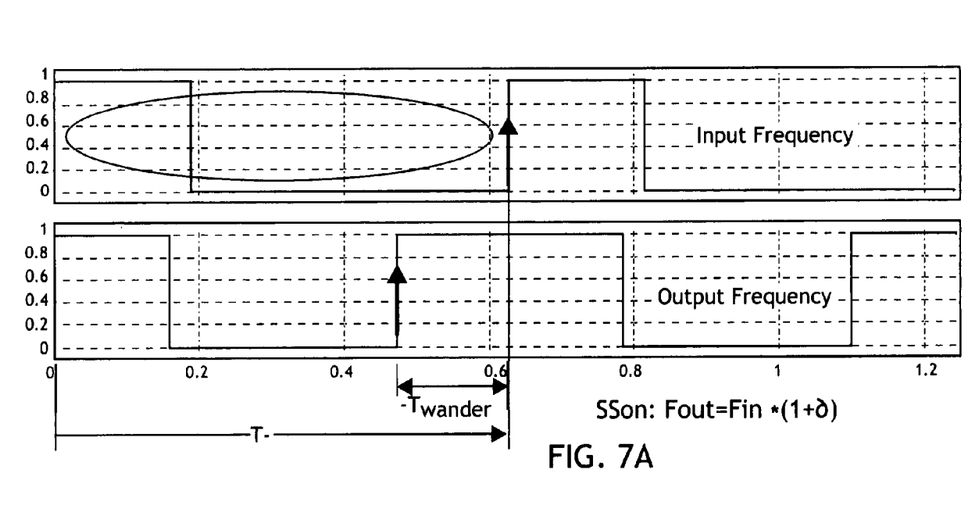
FIGS. 7A and 7B are graphic comparisons of the positive and negative frequency deviations of the spread spectrum output of the invention.
Figure 7B:
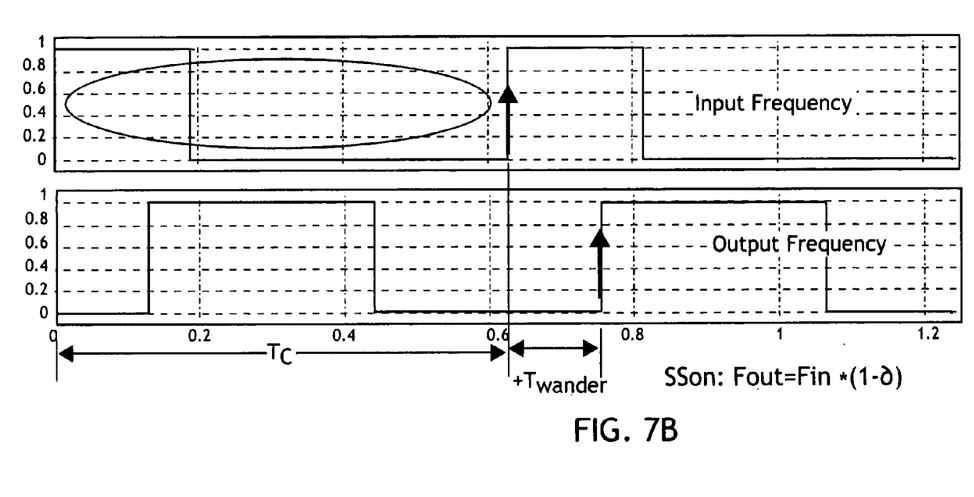

The relationship of the input and output frequencies with respect to the movement of their transition edge alignments is depicted in FIGS. 7A and 7B, showing the same input frequency having a period of Tc, and a is the maximum frequency deviation.

When the spread spectrum modulation is on, it can be shown that the maximum amount of Fout rising edge wander, $T_{WANDER}$, with respect to the $T_{CLK}$ period, can be expressed by the approximate formula shown below, which is valid only for symmetrical, triangular modulation profile. (Note that for perfectly symmetrical, centered, triangular SS modulation waveform at the VCO input, $|+T_{WANDER}|$ may not exactly equal $|-T_{WANDER}|$).

$$\pm \frac{T_{wander}}{T_{clk}} = \pm \partial \left[ \frac{F_{clk}}{4 \cdot F_{mr}} \right]$$

± maximum edge wander with respect to the clock period $$\text{Cycle slip occurs if } \left| \frac{T_{wander}}{T_{clk}} \right| > 1$$

Where:

$\pm \partial$ is the peak % frequency deviation ($\pm 1/100$ or $\pm 1/1000$), $F_{CLK}=1/T_{CLK}$ are the clock frequency and clock period, and $F_{MR}$ is the modulation rate (MR).

Example #1

$\pm \partial = \pm 1\% = \pm 1/100$ $F_{CLK}=100$ MHz $F_{MR}=100$ KHz $T_{WANDER}/T_{CLK} = \pm 2.5 \longrightarrow$ Periods cycle slip occurs Example #2

$\pm \partial = \pm 0.1\% = \pm 1/1000$ $F_{CLK}=100$ MHz $F_{MR}=100$ KHz $T_{WANDER}/T_{CLK} = \pm 0.25$ Periods $\longrightarrow$ zero cycle slip Thus it is clear that if the peak frequency deviation does not exceed a computable limit, there will be no cycle slip. Indeed, given that the peak frequency deviation is a function of the SS modulation signal, it is possible to design a device in accordance with this invention that is guaranteed to produce a SS output signal having zero cycle slip. This is a significant advantage for use as a clock signal generator that provides SS modulation to defeat EMI noise spikes that would otherwise be caused by a constant frequency clock signal.

Figure 8:
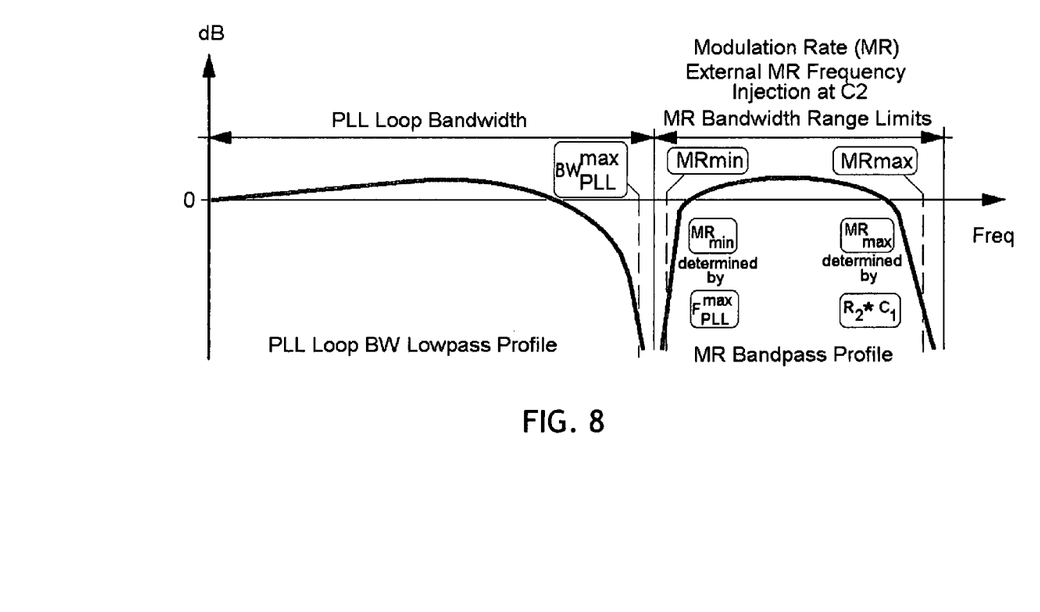
FIG. 8 is a graphic representation of the PLL bandwidth and spread spectrum modulation bandwidth of the invention.

With reference to FIG. 8, it is noted that the SS modulation method of the invention exhibits another interesting and useful trait. The PLL loop bandwidth lowpass profile extends from zero frequency to the $BW_{max}$ point at the upper end of the loop bandwidth. (This frequency is actually much lower than the maximum input/output frequencies of the PLL loop itself.) The SS modulation signal exists in a MR bandpass profile that is higher than the cutoff of the PLL loop bandwidth, extending from $MR_{min}$ to $MR_{max}$. $MR_{min}$ is required to be higher than $BW_{max}$, in that the lowest MR frequency must be greater than the PLL loop bandwidth so that the MR waveform profile is not distorted or cancelled by the PLL closed loop reaction time. Therefore the PLL loop will not process the MR frequency. The MR frequency outside of the PLL closed loop bandwidth makes the MR injection an open loop process. Thus the MR frequency passes through the loop filter, via the VCO, and to the output divider, while the MR signal path is an open loop path, as depicted in FIG. 4. The highest MR frequency $MR_{max}$ is limited by the R2·C1 lowpass bandwidth cutoff characteristics of the PLL loop filter components (resistor 23 and capacitor 26 in FIG. 1).

Figure 9:
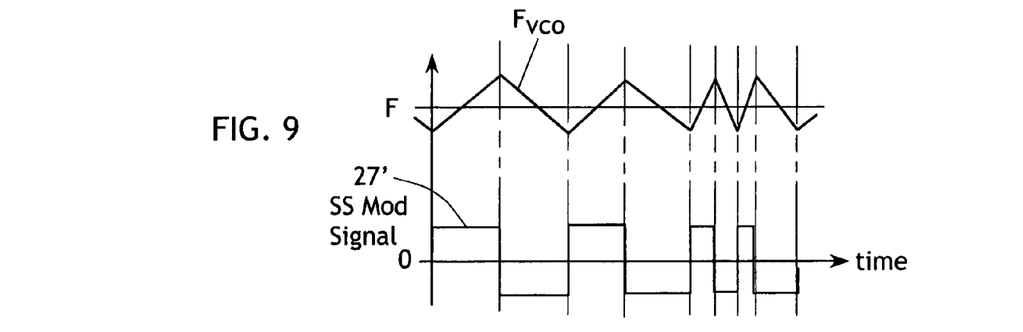
FIG. 9 is a graphic representation of a varying spread spectrum modulation signal and the resulting frequency modulation envelope of the invention.

With regard to FIG. 9, it is possible to provide the invention with a SS modulation signal 27' that is not constant in frequency or pulse width. The result, when injected into the PLL as described above, yields an output signal at the VCO (Fvco) that is not smoothly varying in frequency. Note that as long as the SS mod signal is symmetrical about the zero axis, the Fvco output will vary equally above and below the center frequency F. The changing slope of Fvco output indicates that the change in frequency varies over time, an effect which may be exploited to deal with particular Fourier components of the signal F. The waveform shown is for example only; any such signal may be injected into the PLL, depending only on the desired SS modulation envelope.

Figure 11A:
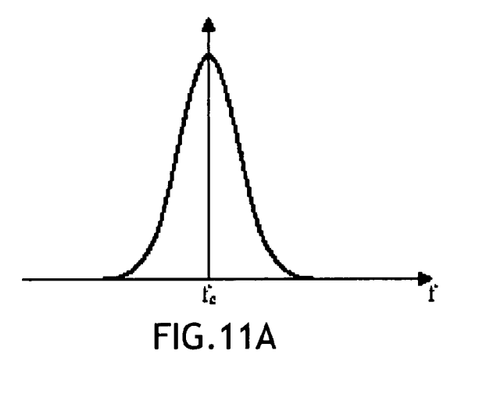
FIGS. 11A-11C are graphic representations of the spectra of an unmodulated clock signal, a clock signal having SS modulation with a triangular modulation profile, and a clock signal having SS modulation with a trigonal modulation profile.
Figure 11B:
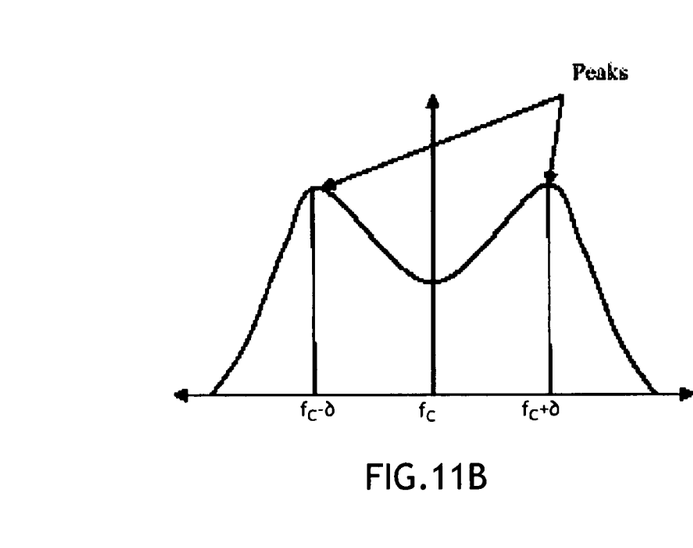
Figure 11C:
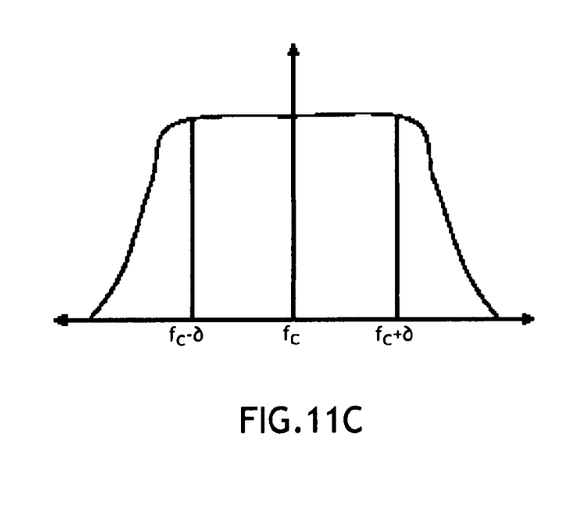
Figure 12:
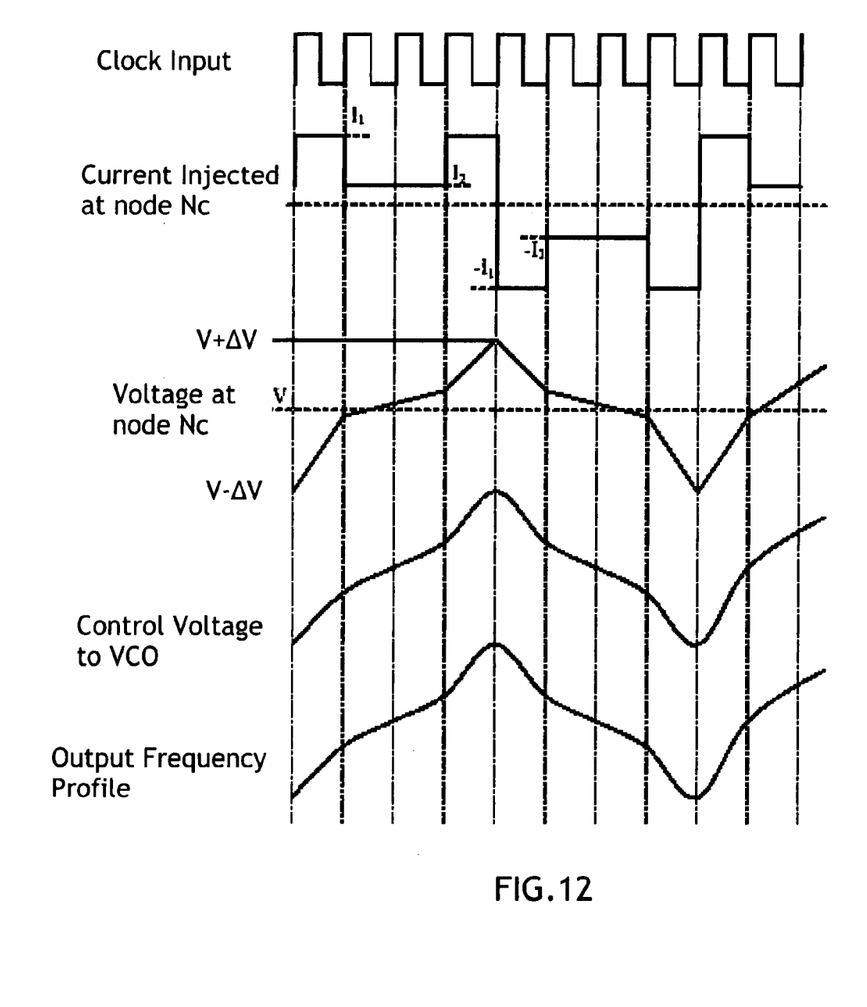
FIG. 12 is a graphic representation of a clock signal, a SS modulating signal for producing a trigonal modulation profile, and the resulting modulation envelope.

With regard to FIG. 11A, it is well known that a constant frequency square wave generates a noise spectrum that is characterized by a spike centered on the frequency $f_c$ of the square wave. The concentration of noise within this spike is often unacceptable with respect to regulations regarding EMI emissions. The SS modulation technique depicted in FIGS. 2-8 results in a noise spectrum shown in FIG. 11B, and it is apparent from a comparison to FIG. 11A that it is effective in diminishing the noise spike centered at frequency $f_c$. However, this SS modulation scheme does produce secondary spikes in the noise spectrum, centered generally at $f_c-\partial$ and $f_c+\partial$. It would be advantageous to attenuate these secondary noise spikes and generate a noise spectrum as shown in FIG. 11C in which the noise amplitude is generally constant across the band from $f_c-\partial$ to $f_c+\partial$. With regard to FIGS. 12 and 13, a further embodiment of the invention is designed to generate the noise spectrum of FIG. 11C. A current signal having a staircase square wave configuration is injected at node Nc of the loop filter of a PLL. The current signal has a cycle that varies in discrete steps from $+I_1$ to $+I_2$ to $+I_1$, to $-I_1$ to $-I_2$ to $--I_1$. The objective is to increase the current pumped to or from the node Nc when the VCO output is in the region of its highest or lowest output frequencies. The resulting effect is to more rapidly sweep through the frequency components near $f_c-\partial$ and $f_c+\partial$ and thus reduce the energy radiated at those frequencies, so that the secondary peaks of the noise spectrum are attenuated. As shown in FIG. 12, the voltage at node Nc has a greater slope (positive and negative) when voltage Nc is near $V+\Delta V$ and $V-\Delta V$, resulting in an output frequency profile (modulation envelope) that closely tracks the Nc voltage. This output frequency profile is termed herein a trigonal waveform, and results in the optimal noise spectrum of FIG. 11C.

Figure 13:
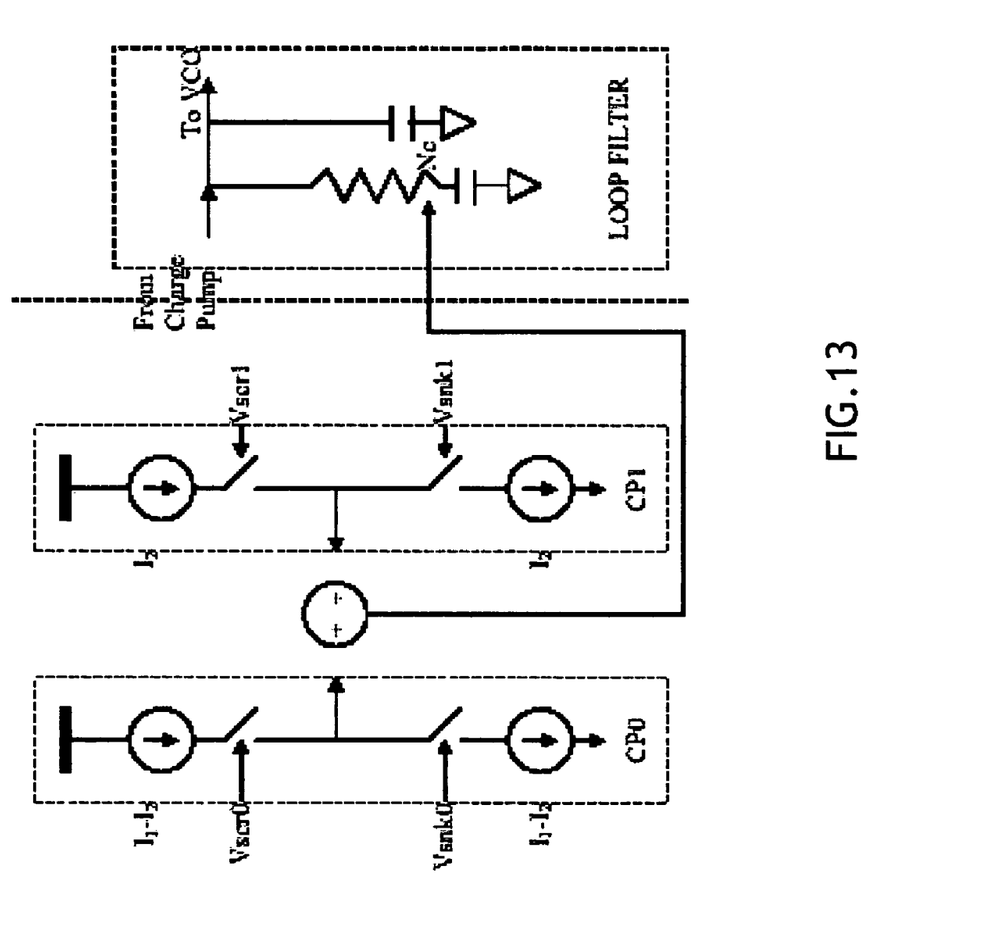
FIG. 13 is a schematic view of a circuit for generating a trigonal modulation profile.
Figure 15:
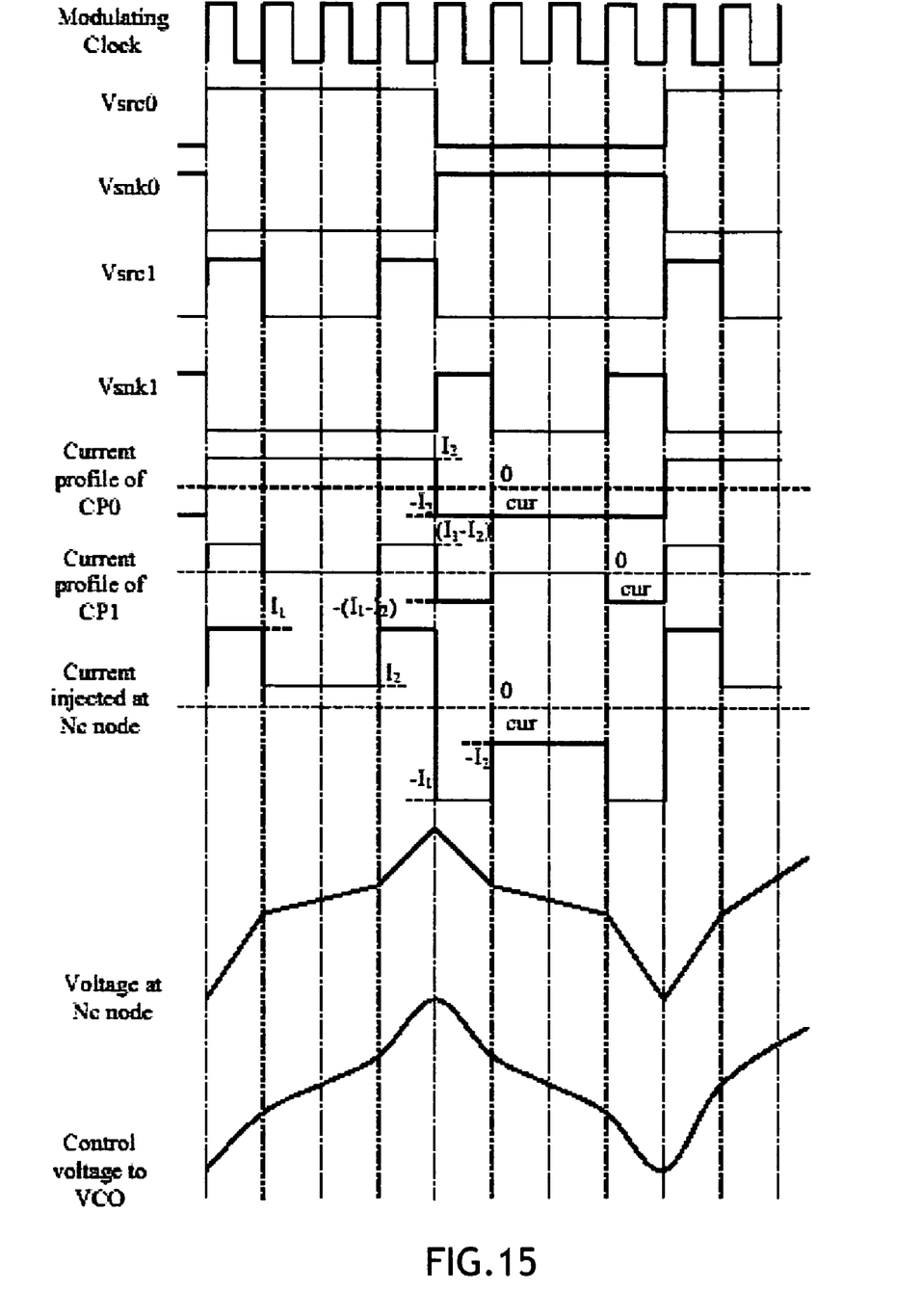
FIG. 15 is a graphic representation of a clock signal, the control voltages as provided in FIG. 14, and the resulting SS modulation profile.

The circuit of FIG. 13 for producing the staircase square wave signal of FIG. 12 includes two charge pumps. One charge pump can source or sink ($I_1-I_2$) amount of current, and the other one can source or sink $I_2$ amount of current. Each charge pump contains two current sources which are controlled by voltage controlled switches $V_{scr0}$ and $V_{scr1}$, and $V_{snk0}$ and $V_{snk1}$. The voltage waveforms to achieve the staircase square wave are shown in FIG. 15.

Figure 14:
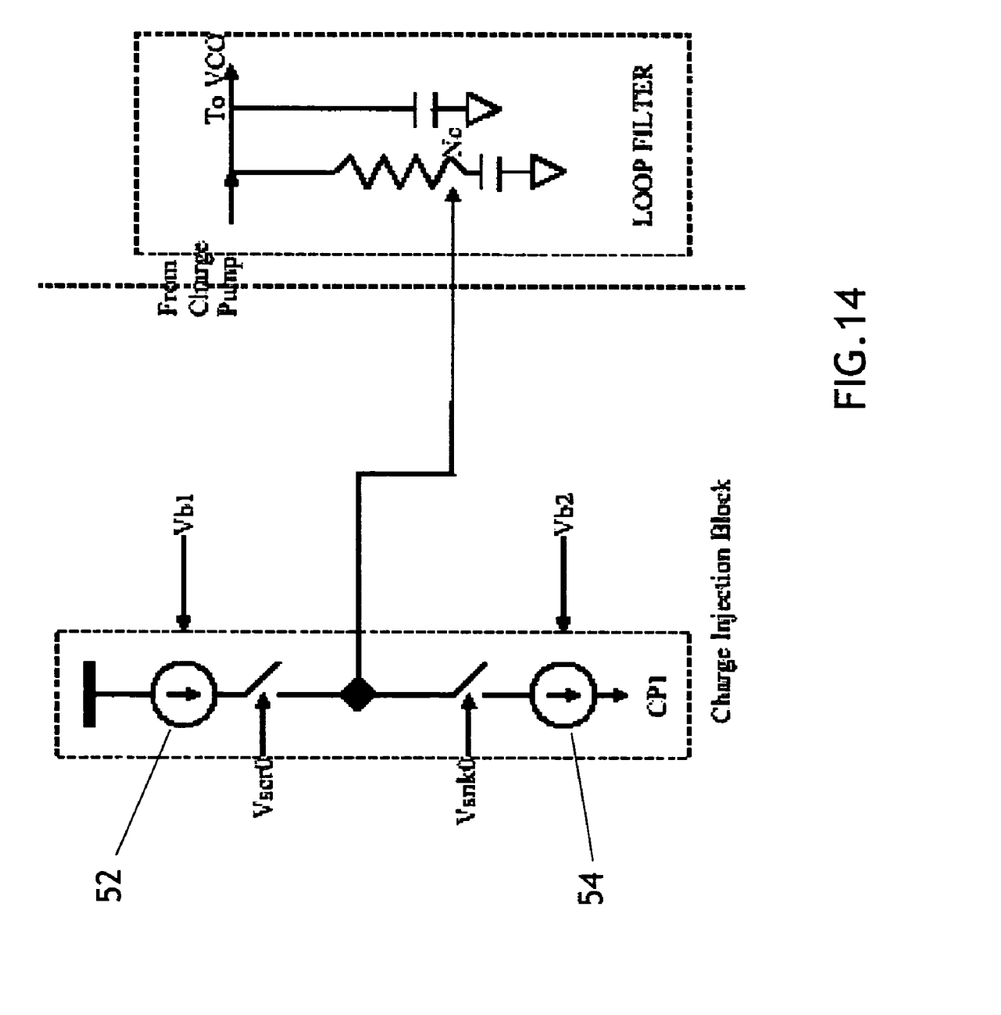
FIG. 14 is a schematic view of a circuit for generating SS modulation profiles by controlling the bias voltages to the current sources of the charge pump.

To generalize from the example of FIGS. 12 and 13, an increase in the number of current steps may enable the generation of a modulation envelope that is even more optimal for some signal applications. This approach would appear to require an increase in the number of charge pumps to deliver more steps in the staircase square wave, a result that may increase the complexity of modulation devices. However, as shown in FIG. 14, a further embodiment of the invention provides the capability of generating complex staircase waveforms while maintaining an uncomplicated circuit arrangement. Two charge pumps 52 and 54 are connected in series by switches $V_{scr0}$ and $V_{snk0}$, with the center node being connected to node Nc of the loop filter (as described previously). Voltages Vb1 and Vb2 are applied to charge pumps 42 and 44, respectively, and are varied in a controlled manner to vary the current pumped from or to the Nc node. Thus many discrete current levels may be generated without resorting to a large number of charge pumps.

The SS modulation signals depicted in FIGS. 2 and 9 are similar in that their duty cycle is approximately 50%, and the positive and negative current flows from cycle to cycle are approximately balanced. However, there may be situations in which the signal to be SS modulated does not have a 50% duty cycle. For example, with reference to FIG. 10, in certain applications the external injection SS modulation signal does not exhibit 50% duty cycle. In a typical video application the HSYNC signal has a 10% duty cycle; i.e., 10% on and 90% off. This signal by itself would produce an asymmetric, skewed frequency deviation envelope, which is generally not desirable.

Figure 10:
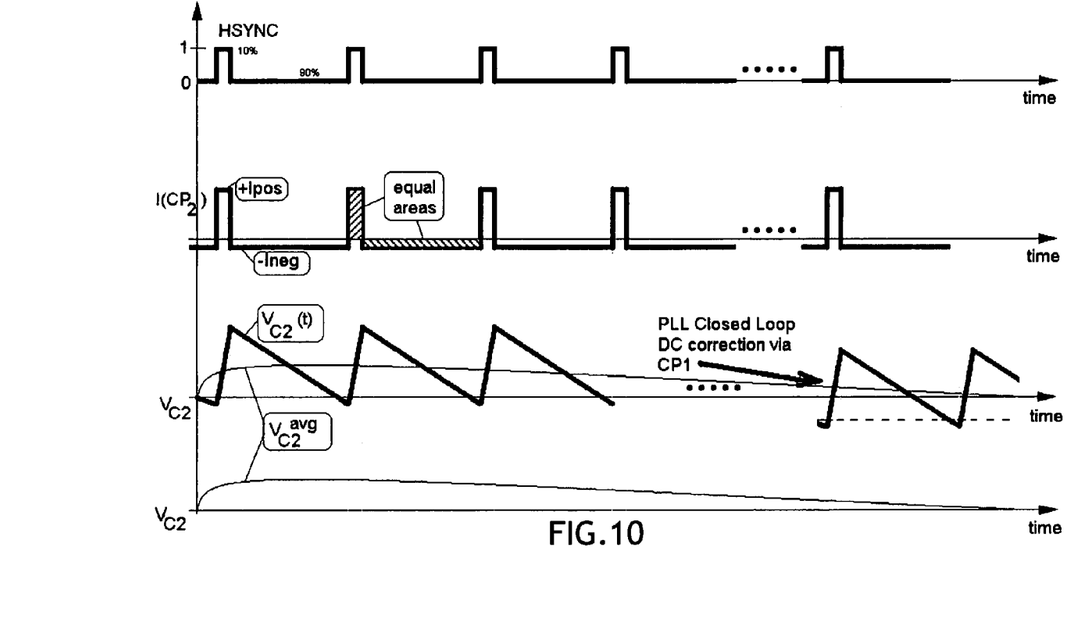
FIG. 10 is a graphic representation of an embodiment of the invention in which the spread spectrum modulation signal is asymmetrical, and is modified by the invention to produce symmetrical SS frequency modulation.

To overcome this potential difficulty, the signal from current pump CP2 is modified so that the signal I(cp2) is balanced. That is, the currents Ipos and Ineg are scaled and made unequal so that Ipos=10·Ineg, whereby the product of one current and its duration is equal to the other current times duration product. That is, the areas of the positive and negative portions of the cycle are equal. In general, the current relationship is Ipos=K·Ineg, where K is the inverse of the duty cycle ratio. This relationship creates a $V_{c2}$ voltage level that is a modified sawtooth shape that varies symmetrically about the average $V_{c2}$. As a result, the asymmetric HSYNC signal produces a symmetrical SS modulation.

Either charge pump CP1 or CP2 may comprise a DAC that is driven by a digital signal which is programmed, derived, downloaded or otherwise created to produce the current signals described herein.

Figure 16:
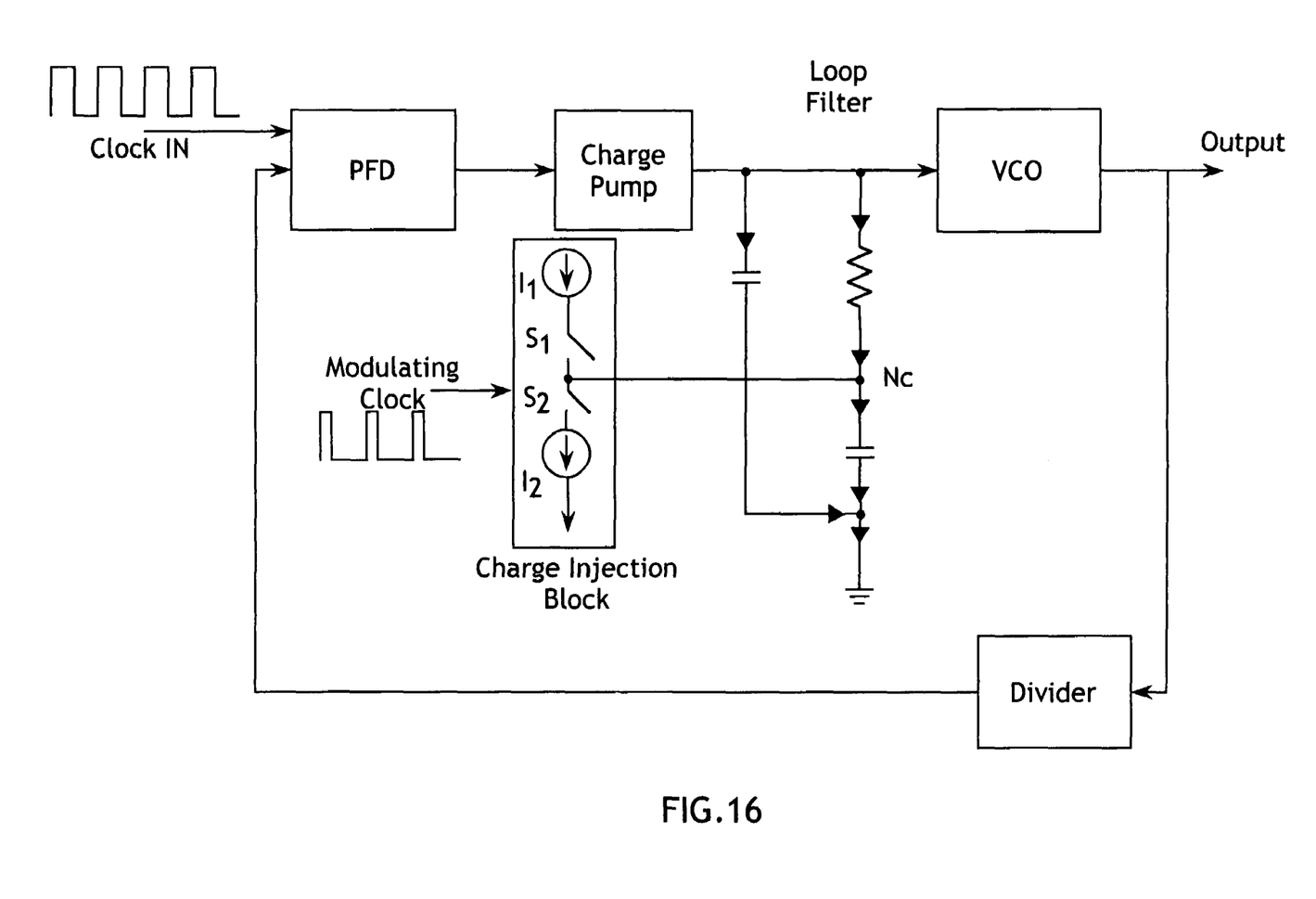
FIG. 16 is a schematic view of a circuit for SS modulation of skewed duty cycle clock signals.

One embodiment of the invention designed to balance the currents Ipos and Ineg is shown in FIG. 16, where charge pumps $I_1$ and $I_2$ are connected in series by switches $S_1$ and $S_2$, with the midpoint connected to deliver the current signal to node Nc of the loop filter. The switches are controlled by a voltage signal, so that $S_1$ is closed and $S_2$ is open when the modulating clock signal is high, and $S_2$ is closed and $S_1$ is open when the modulating clock signal is low. It is required that the charge injected must equal charge taken out. Therefore:

$$Q_{high}=Q_{low}$$

then $I_1 \cdot t_{high} = I_2 * t_{low}$

If the Duty Cycle is given as $\partial$, then $$t_{high}/T=\partial \text{ or}$$

$$t_{high}/(t_{high}+t_{low})=\partial$$

It can be shown that if:

$$I_2=(\partial/(1-\partial)) \cdot I_1$$

then the current flowing into node Nc is equal to the current flowing out of the same node. Given a constant duty cycle, the desired current ratio may be obtained easily. As a result, the frequency is spread equally with respect to the center frequency.

The new method of the invention of direct SS modulation injection into the large C2 capacitor (capacitor 22 in FIG. 1) of the PLL loop filter is simple, and does not require any extra components to interface with or match the VCO input (impedance). The method of the invention enables a device design in which a spread spectrum clock signal output may be generated from a fixed input clock signal, with zero short-term cycle slip between the input and output signals. The symmetrical frequency deviation envelope also determines that there is controllable delay (net) between the input and output clock signal. The combination of controllable delay and zero cycle slip is highly advantageous in EMI reduction clocking of digital devices of many types and uses.

The foregoing description of the preferred embodiments of the invention has been presented for purposes of illustration and description. It is not intended to be exhaustive or to limit the invention to the precise form disclosed, and many modifications and variations are possible in light of the above teaching without deviating from the spirit and the scope of the invention. The embodiment described is selected to best explain the principles of the invention and its practical application to thereby enable others skilled in the art to best utilize the invention in various embodiments and with various modifications as suited to the particular purpose contemplated. It is intended that the scope of the invention be defined by the claims appended hereto.

The invention claimed is:

1. A method for generating a spread spectrum clock signal, including the steps of:
   providing a phase lock loop;
   inputting a constant clock input signal to said phase lock loop;
   injecting a spread spectrum modulating signal into said phase lock loop;
   controlling said phase lock loop so that there is a net zero cycle slip between said spread spectrum clock signal and said constant clock input signal;
wherein:

$$\text{Cycle slip occurs if } \left|\frac{T_{wander}}{T_{clk}}\right| > 1$$

and $$\pm\frac{T_{wander}}{T_{clk}} = \pm\partial\left[\frac{F_{clk}}{4\cdot F_{mr}}\right]$$

wherein $\pm\partial$ is the peak percentage frequency deviation,
$F_{CLK}$ is the clock frequency=$1/T_{CLK}$, where
$T_{CLK}$ is the clock period,
Twander is the varying displacement between corresponding rising edges of said spread spectrum clock signal and said constant clock input signal, and
$F_{MR}$ is the modulation rate.

* * * * *